(12) United States Patent
Miki

(10) Patent No.: US 11,637,566 B2
(45) Date of Patent: Apr. 25, 2023

(54) STORAGE DEVICE AND CONTROL METHOD FOR STORAGE DEVICE

(71) Applicant: FUJITSU LIMITED, Kawasaki (JP)

(72) Inventor: Atsushi Miki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 17/577,422

(22) Filed: Jan. 18, 2022

(65) Prior Publication Data

US 2022/0385304 A1 Dec. 1, 2022

(30) Foreign Application Priority Data

May 26, 2021 (JP) .............................. JP2021-088729

(51) Int. Cl.
*H03M 13/09* (2006.01)
*H03M 13/15* (2006.01)

(52) U.S. Cl.
CPC ....... *H03M 13/098* (2013.01); *H03M 13/095* (2013.01); *H03M 13/152* (2013.01); *H03M 13/1515* (2013.01)

(58) Field of Classification Search
None
See application file for complete search history.

(56) References Cited

U.S. PATENT DOCUMENTS

| 8,429,498 B1* | 4/2013 | Anholt | G06F 11/1048 |
| | | | 714/764 |
| 2013/0117632 A1 | 5/2013 | Fujinami et al. | |
| 2014/0208182 A1 | 7/2014 | Sakai et al. | |
| 2014/0215289 A1* | 7/2014 | Trezise | G06F 11/1048 |
| | | | 714/763 |
| 2018/0091172 A1* | 3/2018 | Ilani | G06F 11/1068 |
| 2020/0159618 A1* | 5/2020 | Oh | G06F 11/1068 |

FOREIGN PATENT DOCUMENTS

| JP | 2013-143118 A | 7/2013 |
| JP | 2014-140111 A | 7/2014 |
| JP | 2016-530655 A | 9/2016 |
| WO | 2015/047228 A1 | 4/2015 |

\* cited by examiner

*Primary Examiner* — Guerrier Merant
(74) *Attorney, Agent, or Firm* — Fujitsu Patent Center

(57) ABSTRACT

A storage device includes: a memory; and a processor configured to, at the time of writing data into the memory, generate a first check code common to a plurality of types of error correction codes from the data on the basis of a correlation relationship between the plurality of types of error correction codes, add the first check code to the data and write the data into the memory, convert the first check code into a second check code based on any one of the plurality of types of error correction codes at the time of reading the data from the memory, and perform error correction by using the second check code.

6 Claims, 19 Drawing Sheets

| 0 | 1 | 2 | 3 | 4 | 5 | 6 | 7 |
|---|---|---|---|---|---|---|---|
| 1 | 1 | 1 | 1 | 1 | 1 | 1 | 1 |
| $\alpha^8$ | 0 | $\alpha^{16}$ | 0 | $\alpha^{24}$ | 0 | $\alpha^{32}$ | 0 |
| 0 | $\alpha^9$ | 0 | $\alpha^{17}$ | 0 | $\alpha^{25}$ | 0 | $\alpha^{33}$ |

$\times \begin{bmatrix} data0 \\ data1 \\ data2 \\ data3 \\ data4 \\ data5 \\ data6 \\ data7 \end{bmatrix} = \begin{matrix} CB_{A0} \\ CB_{A1} \\ CB_{A2} \end{matrix}$

FIG. 18

$$\begin{array}{|c|c|c|c|c|c|c|c|} \hline 0 & 1 & 2 & 3 & 4 & 5 & 6 & 7 \\ \hline 1 & 1 & 1 & 1 & 1 & 1 & 1 & 1 \\ \hline \alpha^8 & \alpha^9 & \alpha^{16} & \alpha^{17} & \alpha^{24} & \alpha^{25} & \alpha^{32} & \alpha^{33} \\ \hline \end{array} \times \begin{bmatrix} data0 \\ data1 \\ data2 \\ data3 \\ data4 \\ data5 \\ data6 \\ data7 \end{bmatrix} = \begin{array}{l} CB_{B0} = CB_{A0} \\ CB_{B1} = CB_{A1} \oplus CB_{A2} \end{array}$$

STORAGE DEVICE AND CONTROL METHOD FOR STORAGE DEVICE

CROSS-REFERENCE TO RELATED APPLICATION

This application is based upon and claims the benefit of priority of the prior Japanese Patent Application No. 2021-88729, filed on May 26, 2021, the entire contents of which are incorporated herein by reference.

FIELD

The embodiments discussed herein are related to a storage device and a control method for the storage device.

BACKGROUND

In recent years, in order to improve a performance of a computer, integration and a size of the computer have been increased, while it has been important to improve reliability of components.

Japanese National Publication of International Patent Application No. 2016-530655, Japanese Laid-open Patent Publication No. 2014-140111, and Japanese Laid-open Patent Publication No. 2013-143118 are disclosed as related art.

SUMMARY

According to an aspect of the embodiments, a storage device includes: a memory; and a processor configured to, at the time of writing data into the memory, generate a first check code common to a plurality of types of error correction codes from the data on the basis of a correlation relationship between the plurality of types of error correction codes, add the first check code to the data and write the data into the memory, convert the first check code into a second check code based on any one of the plurality of types of error correction codes at the time of reading the data from the memory, and perform error correction by using the second check code.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 12 is a diagram illustrating an example of a check matrix of two types of block correction codes;

FIG. 15 is a diagram illustrating a calculation example of the check code with the two types of block correction codes;

FIG. 17 is a diagram illustrating an example of a check matrix in a case where a Reed-Solomon code and a one-bit correction code are combined and a calculation example of a check byte;

FIG. 18 is a diagram illustrating an example of a check matrix of the Reed-Solomon code and a calculation example of the check byte.

DESCRIPTION OF EMBODIMENTS

In recent years, in order to improve a performance of a computer, integration and a size of the computer have been increased, while it has been important to improve reliability of components. In a memory, a phenomenon may occur in which data stored in the memory is changed to invalid data due to neutron rays and a rays from outside, deterioration in an internal element, or the like. Therefore, error information is corrected at the time of reading data from the memory using an error-correcting code (hereinafter, referred to as ECC). The error correction is performed in a flow in which error detection information called a check code (may be called check bit or check byte) is generated, is added to data, and is stored in the memory, information indicating a correction portion is generated using the check code at the time of reading, and correction is performed.

A correction capability of the ECC is limited, and there is a case where the ECC cannot produce an effect if a failure tendency does not match an ECC protection range. However, because the failure tendency of the memory is not known in advance, it is not possible to perform optimum ECC design. Therefore, it is sufficient that a plurality of types of ECC check codes be add to the data and a check code to be used is switched according to a failure occurrence tendency at the time of an operation. However, the number of check codes increases, and a ratio of a check code length with respect to a data length increases, and therefore, a data encoding efficiency is deteriorated.

In one aspect, an object of the embodiment is to provide a storage device that can perform error correction corresponding to a plurality of types of ECCs with a relatively small number of check codes and a control method for the storage device.

Hereinafter, modes for carrying out embodiments will be described with reference to the drawings.

First Embodiment

Figure 1:
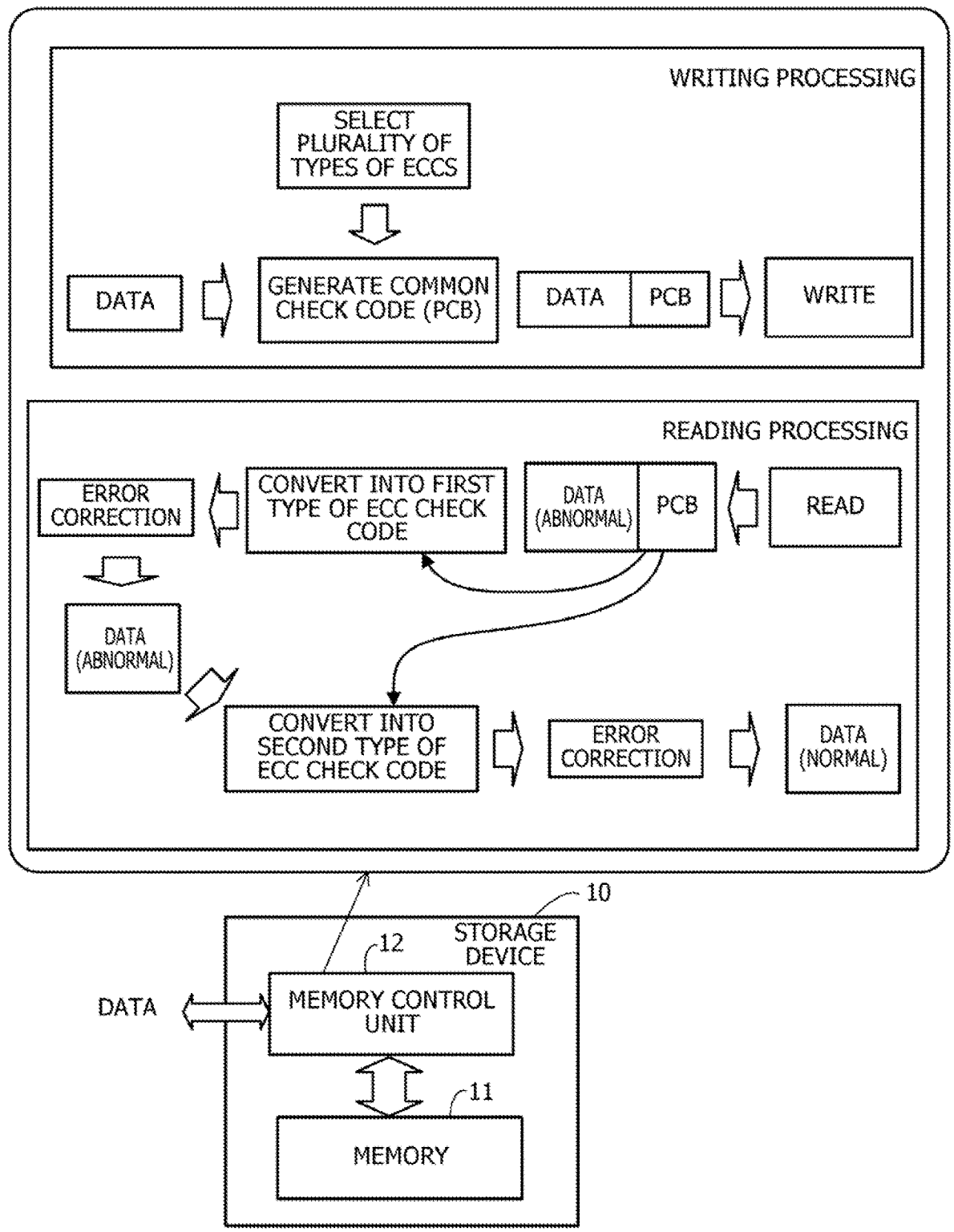
FIG. 1 is a diagram illustrating an example of a storage device and a control method for the storage device according to a first embodiment.

FIG. 1 is a diagram illustrating an example of a storage device and a control method for the storage device according to a first embodiment.

A storage device 10 according to the first embodiment includes a memory 11 and a memory control unit 12.

As the memory 11, various nonvolatile memories or various volatile memories are used. The nonvolatile memory includes, for example, a flash memory, a magneto-resistive random access memory (MRAM), a ferroelectric random access memory (FeRAM), or the like, and the volatile memory includes, for example, a dynamic random access memory (DRAM) or the like.

The memory control unit 12 is a controller that controls writing of data into the memory 11 and reading of data from the memory 11. The memory control unit 12 may also be a memory access controller included in a processor such as a central processing unit (CPU) or a digital signal processor (DSP). The memory control unit 12 executes following processing at the time of writing and at the time of reading.

At the time of writing data into the memory 11, the memory control unit 12 generates a common check code between a plurality of types of ECCs from data on the basis of a correlation relationship between the plurality of types of ECCs. As the plurality of types of ECCs, for example, a plurality of types of block correction codes having different block sizes, Reed-Solomon codes, Bose-Chaudhuri-Hocquenghem (BCH) codes, or the like can be used.

For example, in a case where there is a correlation relationship in which a second type of all ECC check codes can be converted from a first type of ECC check codes, the first type of the ECC check code can be used as the common check code. Furthermore, in a case where there is a correlation relationship in which some of the second type of the ECC check codes can be converted from the first type of the ECC check codes, a common check code can be used in which the first type of the ECC check code is concatenated with the second type of the ECC check code that cannot be converted. Hereinafter, the common check code may be referred to as a pseudo check bit (PCB). Note that a more specific PCB generation example will be described in a second embodiment below.

The memory control unit 12 adds the PCB to the data and writes the data into the memory 11.

On the other hand, at the time of reading the data from the memory 11, the memory control unit 12 converts the PCB into a check code based on any one of a plurality of types of error correction codes and performs error correction using the check code.

The memory control unit 12 converts the PCB into the check code on the basis of a conversion formula at the time of generating the PCB or the like. For example, in a case where the PCB is the first type of the ECC check code and in a case where a conversion formula from the first type of the ECC check code into the second type of the ECC check code is obtained, the PCB is converted into the second type of the ECC check code using the conversion formula.

An error position is obtained according to information called a syndrome that is calculated using a matrix product of a check matrix to be described later and a column vector based on the read data and a check code obtained by conversion.

In FIG. 1, an example of a processing example (control method for storage device 10) of the memory control unit 12 is illustrated.

In the writing processing, the memory control unit 12 selects a plurality of types of ECCs, generates a PCB from the received data, adds the PCB to the data, and writes the data into the memory 11. In the reading processing, in a case where abnormal data (data including error) and the PCB are read, the memory control unit 12 converts the PCB into, for example, the first type of the ECC check code. Then, the memory control unit 12 detects an error using the check code and corrects the detected error.

However, in a case where it is not possible to correct the error with the first type of the ECC check code, the memory control unit 12 converts the PCB into the second type of the ECC check code. Then, the memory control unit 12 detects an error using the check code and corrects the detected error. In the example in FIG. 1, in a case where the second type of the ECC check code is used, the error is corrected, and normal data is obtained.

According to the storage device 10 as described above, the common check code (PCB) based on the correlation relationship between the plurality of types of ECCs is added to the data and is written, and the PCB is converted into any one of the plurality of types of ECC check codes at the time of reading. As a result, error correction corresponding to the plurality of types of ECCs can be performed without adding the plurality of types of ECC check codes, to the data, in a format in which the plurality of types of ECC check codes is concatenated. That is, for example, error correction corresponding to the plurality of types of ECCs can be performed with the relatively small number of check codes.

Second Embodiment

Next, a storage device and a control method thereof according to a second embodiment will be described.

Figure 2:
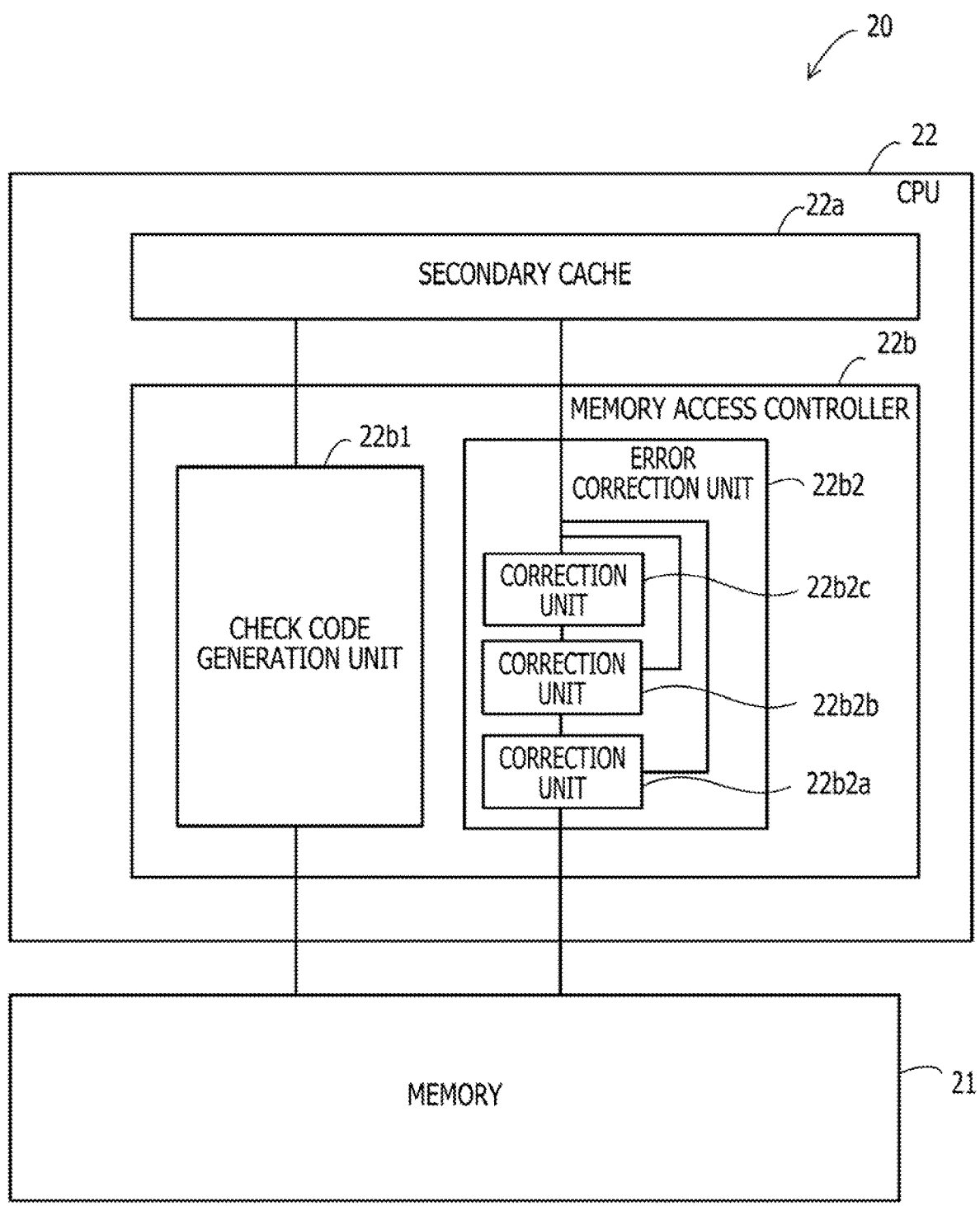
FIG. 2 is a diagram illustrating an example of a storage device according to a second embodiment.

FIG. 2 is a diagram illustrating an example of the storage device according to the second embodiment.

A storage device 20 according to the second embodiment includes a memory 21 and a CPU 22.

As the memory 21, for example, various nonvolatile memories or various volatile memories as described above are used.

The CPU 22 includes a secondary cache 22a and a memory access controller 22b. Illustration of other components of the CPU 22 is omitted.

The secondary cache 22a temporarily stores data to be written into the memory 21 and data read from the memory 21.

The memory access controller 22b controls writing of data into the memory 21 and reading of data from the memory 21 and has a function for generating a PCB, a function for performing error detection and error correction, or the like.

The memory access controller 22b includes a check code generation unit 22b1 and an error correction unit 22b2.

At the time of writing data into the memory 21, the check code generation unit 22b1 generates the above-described PCB that is a common check code between a plurality of types of ECCs from the data on the basis of a correlation relationship between the plurality of types of ECCs. The PCB is added to the data and is written into the memory 21.

At the time of reading the data from the memory 21, the error correction unit 22b2 converts the PCB added to the data into a check code based on any one of the plurality of types of ECCs and performs error correction using the check code.

In the example in FIG. 2, the error correction unit 22b2 includes correction units 22b2a, 22b2b, and 22b2c.

The correction unit 22b2a converts the PCB into a check code based on a first type of an ECC and performs error correction using the check code. In a case where it is not possible for the correction unit 22b2a to perform error correction, the correction unit 22b2b converts the PCB into a check code based on a second type of an ECC and performs error correction using the check code. In a case where it is not possible for the correction units 22b2a and 22b2b to perform error correction, the correction unit 22b2c converts the PCB into a check code based on a third type of an ECC and performs error correction using the check code.

Note that the number of types of applicable ECCs is not limited to three and may also be two or equal to or more than four.

Next, before explaining a control method and an effect of the storage device 20 according to the second embodiment, a control method for a storage device according to a comparative example will be described.

Comparative Example

A control method for a storage device according to a comparative example below is a method in which a check code based on one type of ECC is added to data in order to suppress the number of check codes to be added to the data, and in a case where it is not possible to perform error correction, the check code is replaced with a check code based on a different type of ECC and is rewritten. That is, for example, in a case where it is not possible to perform error correction, a check code generated by a different type of error correction logic is added to the data, and rewriting is performed.

Figure 3:
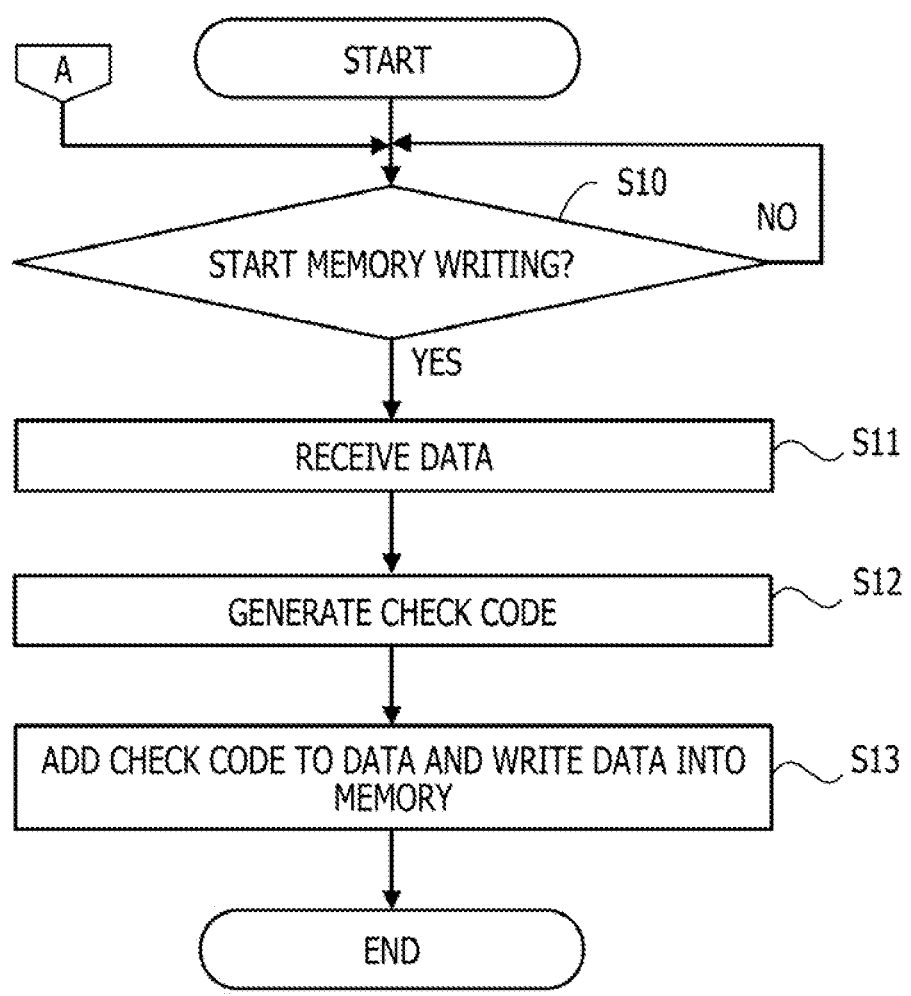
FIG. 3 is a flowchart illustrating a flow of writing processing according to a control method for a storage device according to a comparative example.

FIG. 3 is a flowchart illustrating a flow of writing processing according to the control method for the storage device according to the comparative example.

Figure 4:
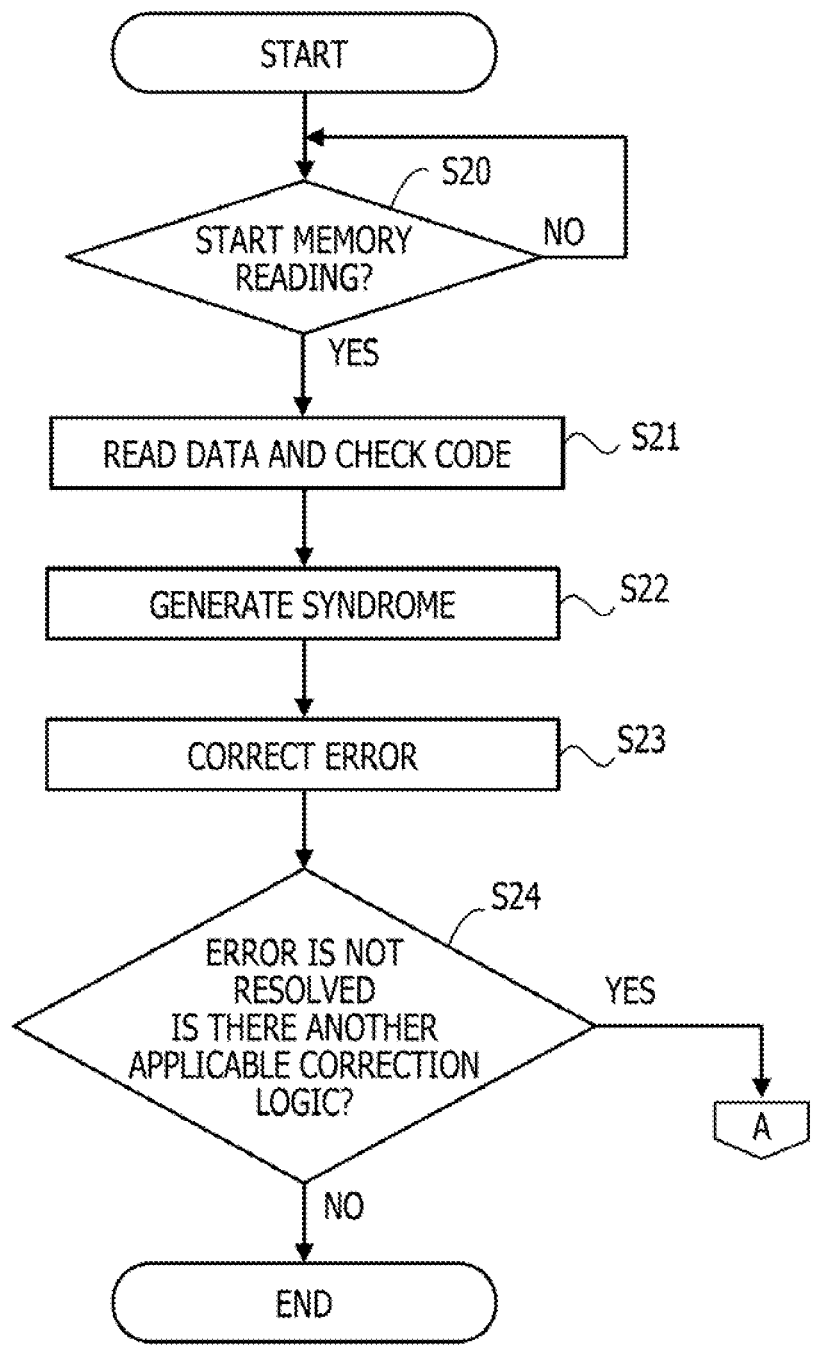
FIG. 4 is a flowchart illustrating a flow of reading processing according to the control method for the storage device according to the comparative example.

Furthermore, FIG. 4 is a flowchart illustrating a flow of reading processing according to the control method for the storage device according to the comparative example.

Figure 5:
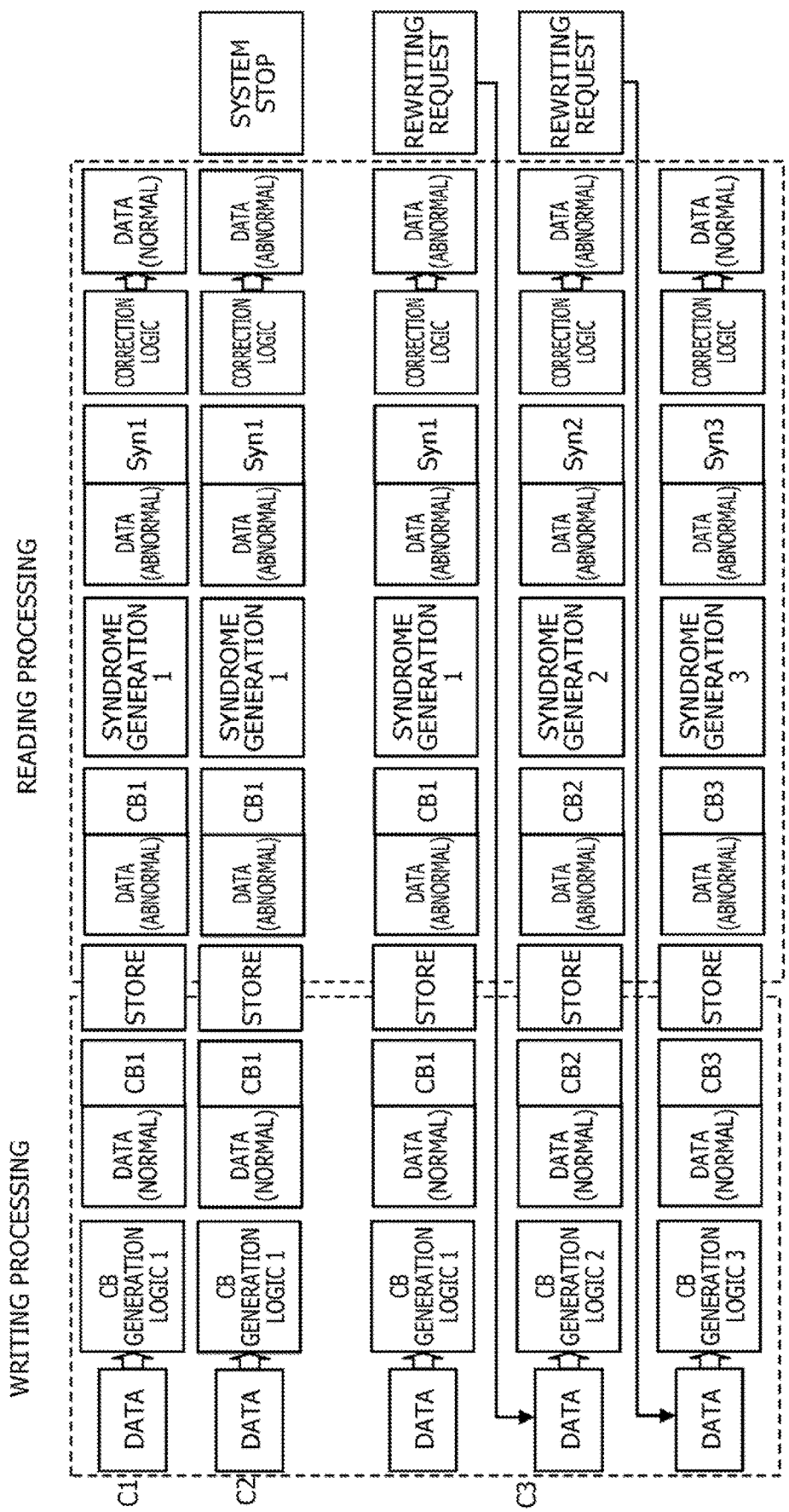
FIG. 5 is a diagram for explaining a plurality of cases of error correction by an ECC with the control method for the storage device according to the comparative example.

Furthermore, FIG. 5 is a diagram for explaining a plurality of cases of error correction by an ECC with the control method for the storage device according to the comparative example.

As illustrated in FIG. 3, in the memory writing processing, the storage device according to the comparative example determines whether or not memory writing is started, for example, on the basis of receipt of a memory writing command or the like (step S10) and repeats the processing in step S10 until it is determined that memory writing is started.

In a case where it is determined that memory writing is started, the storage device according to the comparative example receives data (step S11) and generates a check code based on one type of an ECC (step S12). Then, the storage device according to the comparative example adds the check code to the data and writes the data into the memory (step S13) and ends the memory writing processing.

As illustrated in FIG. 4, in the memory reading processing, the storage device according to the comparative example determines whether or not memory reading is started, for example, on the basis of receipt of a memory reading command or the like (step S20) and repeats the processing in step S20 until it is determined that memory reading is started.

In a case where it is determined that memory reading is started, the storage device according to the comparative example reads the data and the check code added to the data from the memory (step S21). Then, the storage device according to the comparative example generates information indicating a data correction location called a syndrome from the check code (step S22) and performs error correction on the basis of the generated syndrome (step S23).

C1 in FIG. 5 illustrates a case where data is normally corrected through error correction. The "CB generation logic 1" in FIG. 5 indicates that a check code "CB1" is generated on the basis of the first type of the ECC. In a case where an abnormality occurs in data when the data is stored in the memory as in FIG. 5 (in a case where error occurs), a syndrome "Syn1" is generated on the basis of "CB1" through "syndrome generation 1" that is syndrome generation processing. Then, "correction logic" is applied on the basis of "Syn1", and error correction is performed.

In a case where error correction is performed only for one type of an ECC, in a case where it is not possible to correct an error as in a case of C2, a system stops.

Therefore, as in a case of C3, in a case where it is not possible to correct an error through error correction based on the first type of the ECC, the storage device according to the comparative example issues a rewriting request.

In the example in FIG. 5, a check code "CB2" is generated on the basis of the second type of the ECC by the "CB generation logic 2" from data that is received again, and "Syn2" is generated on the basis of "CB2" through "syndrome generation 2" at the time of reading. Then, "correction logic" is applied on the basis of "Syn2", and error correction is performed. In the example in FIG. 5, it is not possible to correct the error even through error correction based on the second type of the ECC, and the storage device according to the comparative example issues the rewriting request. A check code "CB3" is generated on the basis of the third type of the ECC by the "CB generation logic 3" from data that is received again, and "Syn3" is generated on the basis of "CB3" through "syndrome generation 3" at the time of reading. Then, "correction logic" is applied on the basis of "Syn3", and error correction is performed. In the example in FIG. 5, the error is corrected through error correction based on the third type of the ECC, and normal data is obtained.

Since the processing as in C3 in FIG. 5 is executed, the error is not resolved after the processing in step S23 as in FIG. 4, and the storage device according to the comparative example determines whether or not there is another applicable correction logic (meaning correction by another type of ECC) (step S24).

In a case of determining that the error is resolved or in a case of determining that the error is not resolved and there is no another applicable correction logic, the storage device according to the comparative example ends the reading processing. In a case of determining that the error is not resolved and there is another applicable correction logic, the storage device according to the comparative example issues the rewriting request and repeats the processing from step S10 in FIG. 3. In that case, in the processing in step S12, a check code based on the another correction logic is generated.

According to the control method for the storage device according to the comparative example as described above, in a case where correction logics having a sufficient correction capability are selected and replaced, data rewriting into the memory is needed as in FIG. 5, and there is a possibility that this adversely affects a system performance.

Control Method for Storage Device According to Second Embodiment

Figure 6:
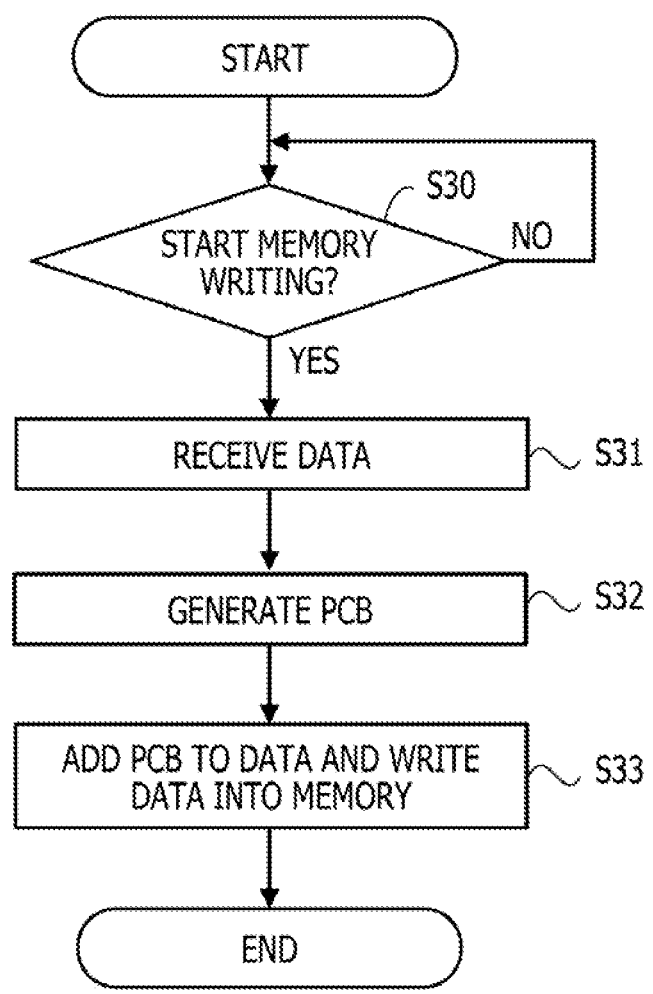
FIG. 6 is a flowchart illustrating a flow of writing processing according to a control method for the storage device according to the second embodiment.

FIG. 6 is a flowchart illustrating a flow of writing processing according to the control method for the storage device according to the second embodiment.

In the memory writing processing, the memory access controller 22b of the storage device 20 determines whether or not memory writing is started, for example, based on receipt of a memory writing command or the like (step S30). The memory access controller 22b repeats the processing in step S30 until it is determined that memory writing is started.

In a case where it is determined that memory writing is started, the check code generation unit 22b1 of the memory access controller 22b receives data to be written from the secondary cache 22a (step S31) and generates a PCB from the received data (step S32). An example of PCB generation processing will be described later.

The memory access controller 22b adds the PCB to the data and writes the data into the memory 21 (step S33) and ends the memory writing processing.

Figure 7:
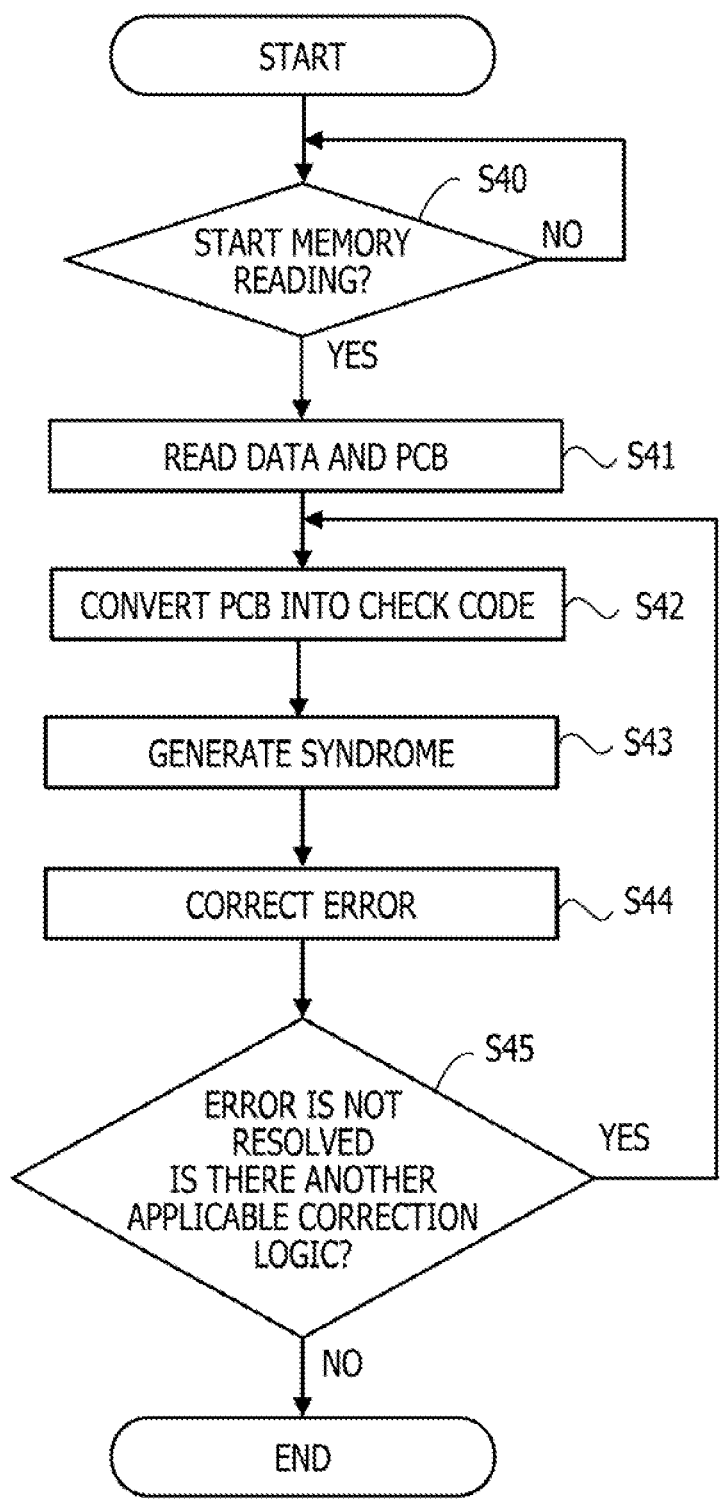
FIG. 7 is a flowchart illustrating a flow of reading processing according to the control method for the storage device according to the second embodiment.

FIG. 7 is a flowchart illustrating a flow of reading processing according to the control method for the storage device according to the second embodiment.

In the memory reading processing, the memory access controller 22b determines whether or not memory reading is started, for example, based on receipt of a memory reading command or the like (step S40) and repeats the processing in step S40 until it is determined that memory reading is started.

In a case where it is determined that memory reading is started, the memory access controller 22b reads the data and the PCB added to the data from the memory 21 (step S41). Then, the error correction unit 22b2 of the memory access controller 22b converts the PCB into a check code based on any one of the plurality of types of ECCs (plurality of error correction logics) (step S42). Then, the error correction unit 22b2 generates a syndrome using the check code (step S43) and performs error correction on the basis of the generated syndrome (step S44).

The error correction unit 22b2 determines whether or not an error is not resolved and there is another applicable correction logic (step S45).

In a case of determining that the error is resolved or in a case of determining that the error is not resolved and there is no another applicable correction logic, the error correction unit 22b2 ends the reading processing. In a case where it is determined that the error is not resolved and there is the another applicable correction logic, the error correction unit 22b2 repeats the processing from step S42. In that case, in the processing in step S42, the PCB is converted into the check code based on the another correction logic.

Figure 8:
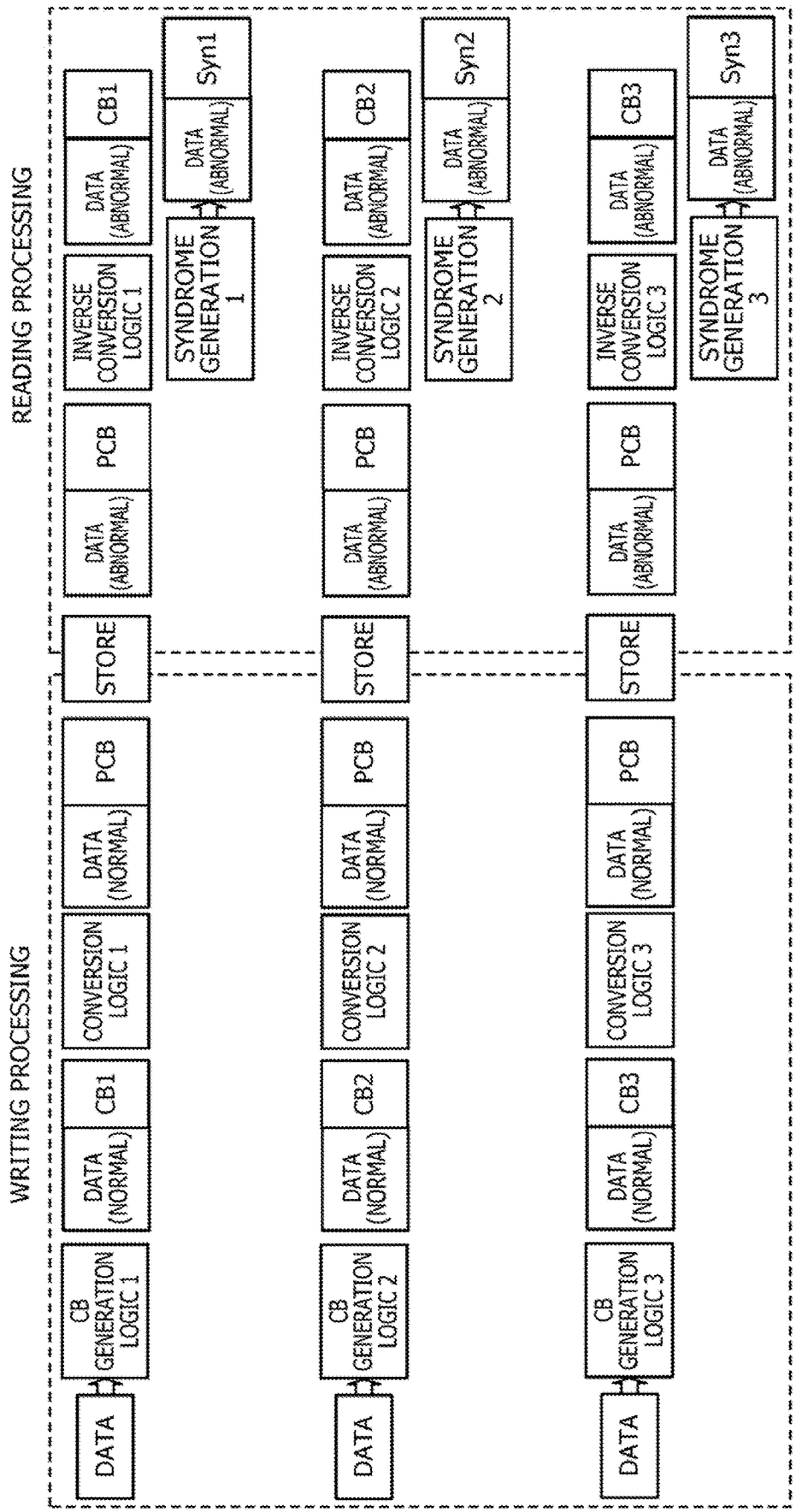
FIG. 8 is a diagram (part 1) illustrating an example using a common pseudo check bit (PCB) between three correction logics.
Figure 9:
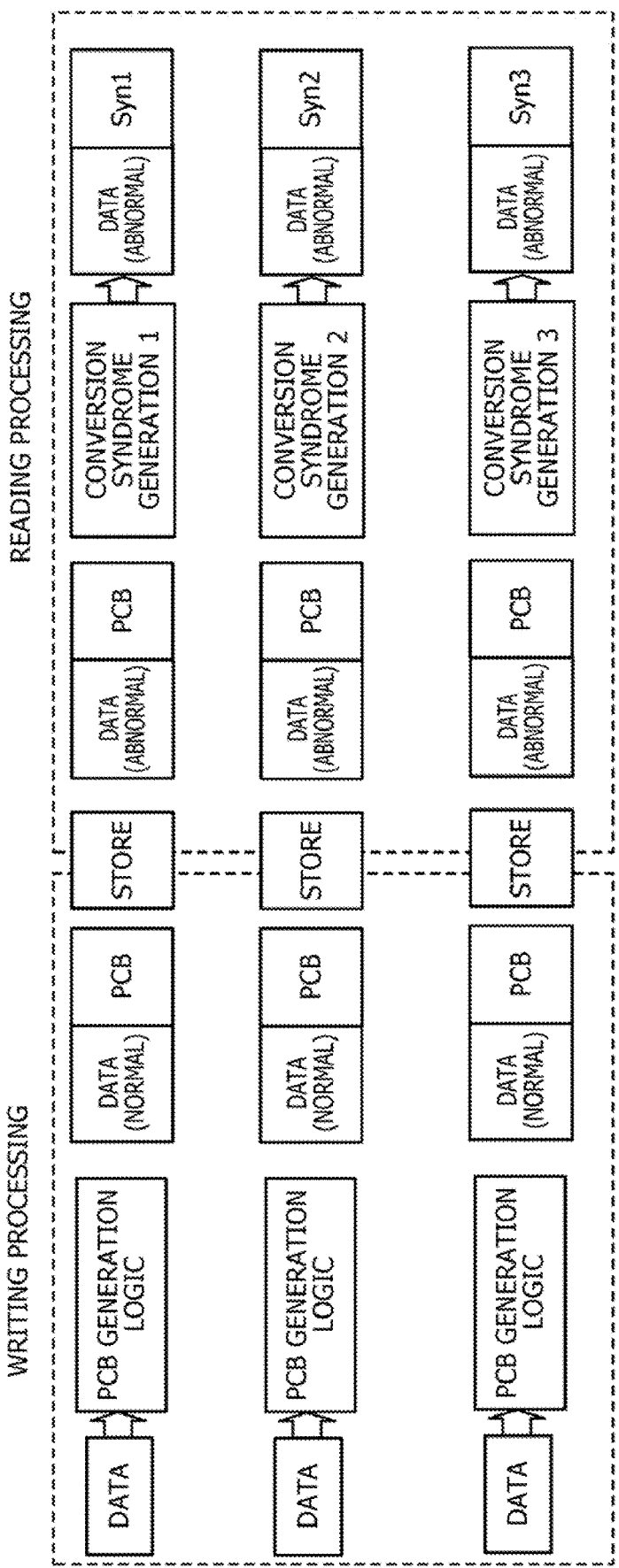
FIG. 9 is a diagram (part 2) illustrating an example using a common PCB between the three correction logics.

FIGS. 8 and 9 are diagrams illustrating an example using a common PCB between three correction logics.

As illustrated in FIG. 8, the check code generation unit 22b1 converts check codes "CB1 to CB3" respectively generated by three types of the "CB generation logic 1" to the "CB generation logic 3" into a common PCB through conversion by a "conversion logic 1" to a "conversion logic 3". The PCB is added to the data and is stored in the memory 21.

Then, at the time of reading, the error correction unit 22b2 converts the common PCB into any one of "CB1" to "CB3" by any one of an "inverse conversion logic 1" to an "inverse conversion logic 3" and generates "Syn1" to "Syn3" respectively through the "syndrome generation 1" to the "syndrome generation 3".

Note that the "CB generation logic 1" to the "CB generation logic 3" and the "conversion logic 1" to the "conversion logic 3" are assumed to be integrated and can be expressed as a "PCB generation logic" as in FIG. 9. Furthermore, the "inverse conversion logic 1" to the "inverse conversion logic 3" and the "syndrome generation 1" to the "syndrome generation 3" are respectively assumed to be integrated and can be expressed as "conversion syndrome generation 1" to "conversion syndrome generation 3" as in FIG. 9.

Figure 10:
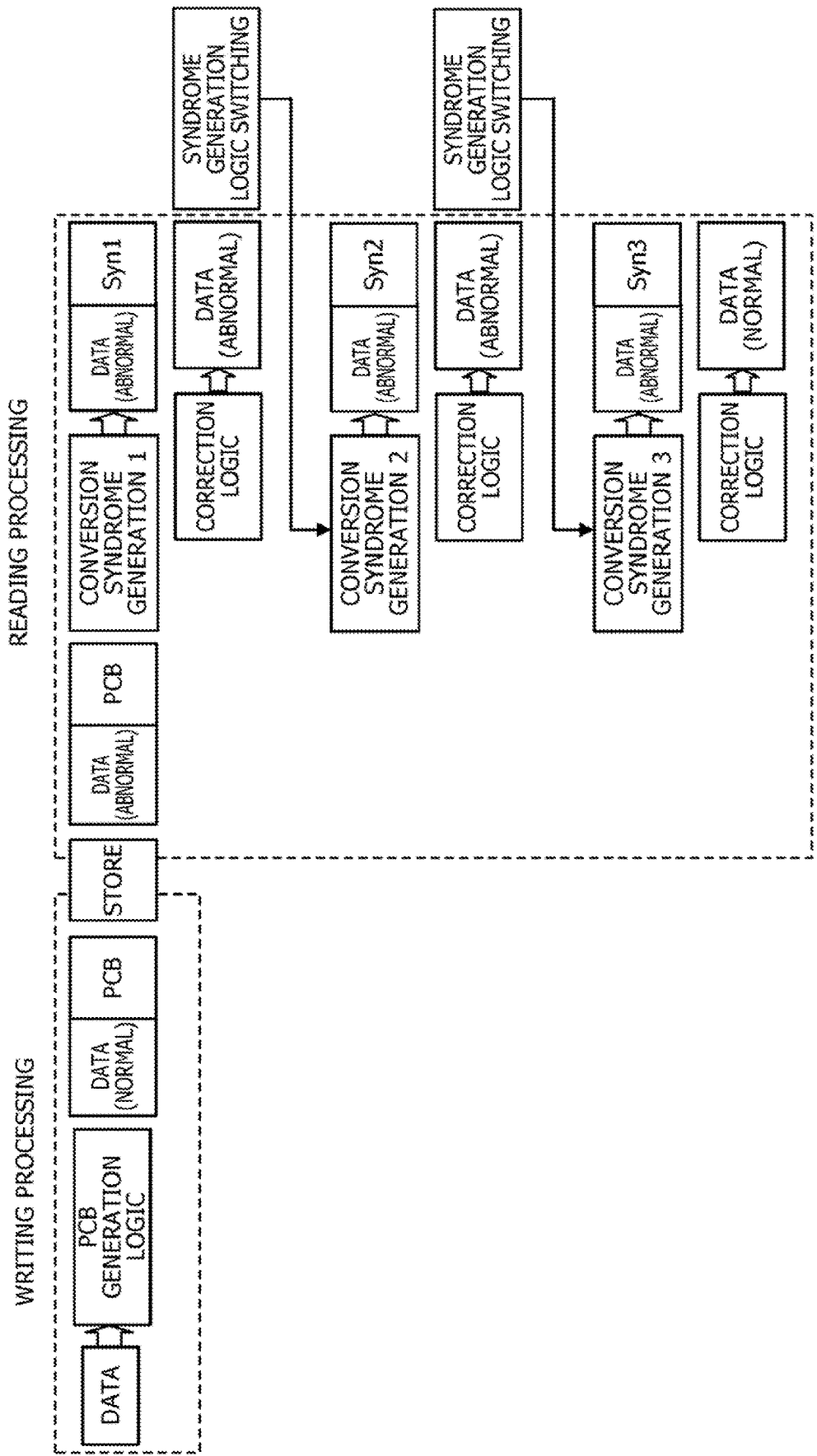
FIG. 10 is a diagram illustrating an example of switching the correction logics.

FIG. 10 is a diagram illustrating an example of switching the correction logics.

In the writing processing, the check code generation unit 22b1 generates, for example, the common PCB between the three correction logics from the data by the "PCB generation logic". The PCB is added to the data and is stored in the memory 21.

In a case where an abnormality occurs in the data when the data is stored in the memory as in FIG. 10 (in a case where error occurs), the correction unit 22b2a of the error correction unit 22b2 converts the PCB into "CB1" through the "conversion syndrome generation 1". Moreover, the correction unit 22b2a generates "Syn1" on the basis of a matrix product of a check matrix to be described later and a column vector of the read data and "CB1" through the "conversion syndrome generation 1". Then, the correction unit 22b2a performs error correction by the "correction logic" on the basis of "Syn1" (error correction by first type of ECC).

As in the example in FIG. 10, in a case where it is not possible to correct an error through error correction by the first type of the ECC, the error correction unit 22b2 switches the syndrome generation logic, and the correction unit 22b2b converts the PCB into "CB2" through the "conversion syndrome generation 2". Moreover, the correction unit 22b2b generates "Syn2" on the basis of a matrix product of a check matrix to be described later and a column vector of the read data and "CB2" through the "conversion syndrome generation 2". Then, the correction unit 22b2b performs error correction by the "correction logic" on the basis of "Syn2" (error correction by second type of ECC).

As in the example in FIG. 10, in a case where it is not possible to correct an error through error correction by the second type of the ECC, the error correction unit 22b2 switches the syndrome generation logic, and the correction unit 22b2c converts the PCB into "CB3" through the "conversion syndrome generation 3". Moreover, the correction unit 22b2c generates "Syn3" on the basis of a matrix product of a check matrix to be described later and a column vector of the read data and "CB3" through the "conversion syndrome generation 3". Then, the correction unit 22b2c performs error correction by the "correction logic" on the basis of "Syn3" (error correction by third type of ECC). In the example in FIG. 10, the error is corrected through error correction based on the third type of the ECC, and normal data is obtained.

According to the storage device 20 according to the second embodiment as described above, the common check code (PCB) based on the correlation relationship between the plurality of types of ECCs is added to the data and is written, and the PCB is converted into any one of the plurality of types of ECC check codes at the time of reading. As a result, error correction corresponding to the plurality of types of ECCs can be performed without adding the plurality of types of ECC check codes, to the data, in a format in which the plurality of types of ECC check codes is concatenated. That is, for example, error correction corresponding to the plurality of types of ECCs can be performed with the relatively small number of check codes.

Furthermore, as in the comparative example described above, in a case where the type of the ECC to be used (correction logic) is switched, rewriting is not needed as illustrated in FIG. 10.

PCB Generation Example

Hereinafter, a PCB generation example will be described.

Figure 11:
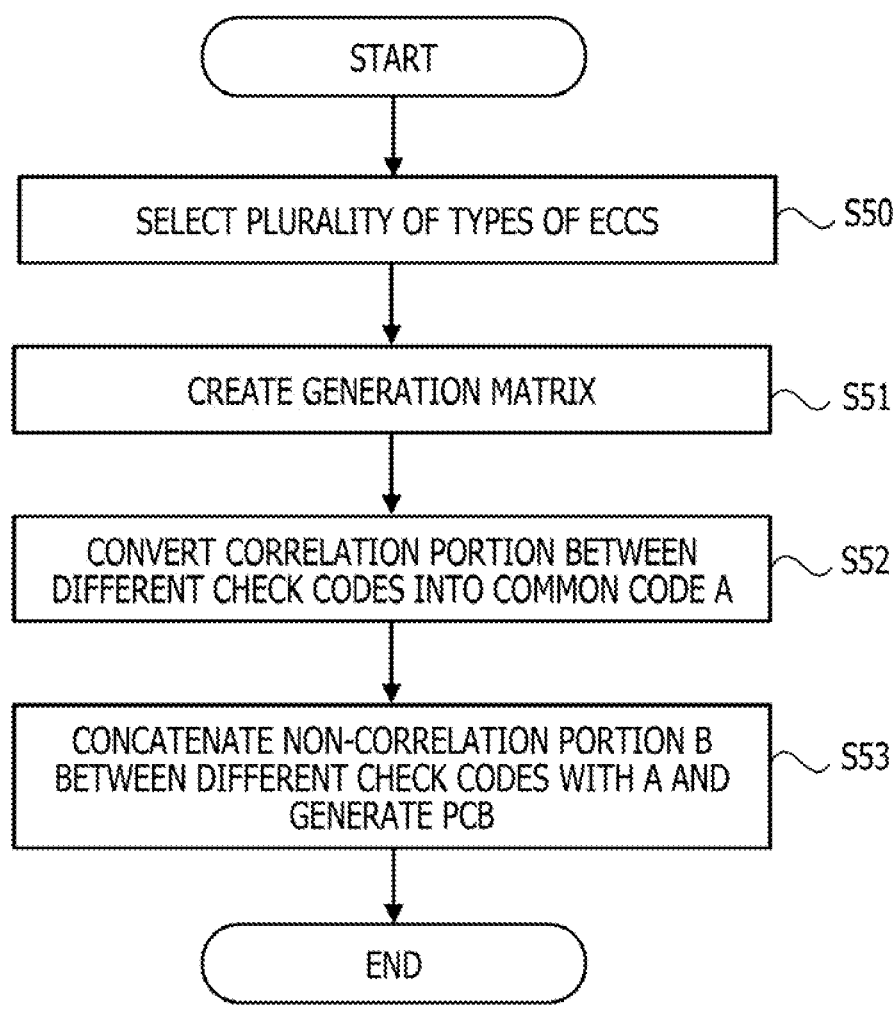
FIG. 11 is a flowchart illustrating a flow of an example of PCB generation processing.

FIG. 11 is a flowchart illustrating a flow of an example of PCB generation processing.

The check code generation unit 22b1 selects a plurality of types of ECCs (step S50). The plurality of types of ECCs includes, for example, a plurality of types of block correction codes having different block sizes, Reed-Solomon codes, BCH codes, or the like.

Then, the check code generation unit 22b1 generates a generation matrix so that check codes based on the plurality of types of the ECCs have a correlation (step S51). An example of the generation matrix will be described later.

The check code generation unit 22b1 converts a correlation portion between different check codes into a common code A (step S52) and concatenates a non-correlation portion B between the different check codes with A and generates a PCB (step S53).

Application Example (Part 1) to Two Types of Block Correction Codes

First, for simplicity, an example is described where two types of block correction codes are applied to 12-bit data (data 0 to data 11).

Of the two types of block correction codes, a correction logic of one block correction code (first correction logic) is to divide the 12-bit data into four bits × three blocks and correct a one-bit error in each block. A correction logic of another block correction code (second correction logic) is to divide the 12-bit data into six bits×two blocks and correct a one-bit error in each block.

Figure 12:
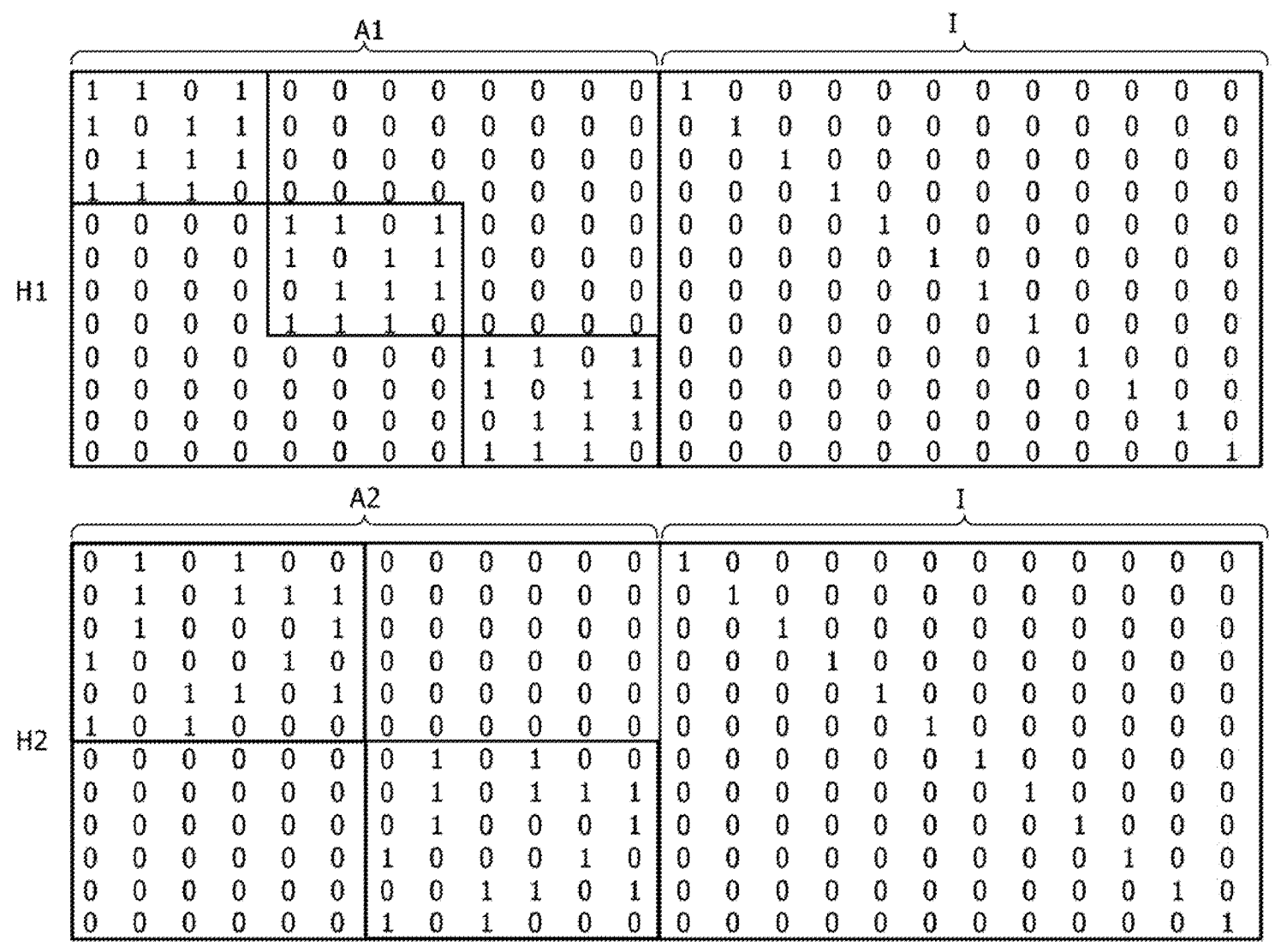

FIG. 12 is a diagram illustrating an example of a check matrix of the two types of block correction codes.

H1 is an example of a check matrix in a case where the first correction logic is used, and H2 is an example of a check matrix in a case where the second correction logic is used. Each of H1 and H2 is a matrix in which a matrix from a first column to a 12-th column (A1 and A2) and a unit matrix (I) of 12 rows×12 columns from a 13-th column to a 24-th column are concatenated.

The generation matrix used to generate the check code includes a transposed matrix of A1 and A2 as a 13-th column to a 24-th column and I from a first column to a 12-th column. However, the check code can be expressed as in FIG. 13 using A1 and A2. Therefore, A1 and A2 can be called a generation matrix (or a part thereof).

Figure 13:
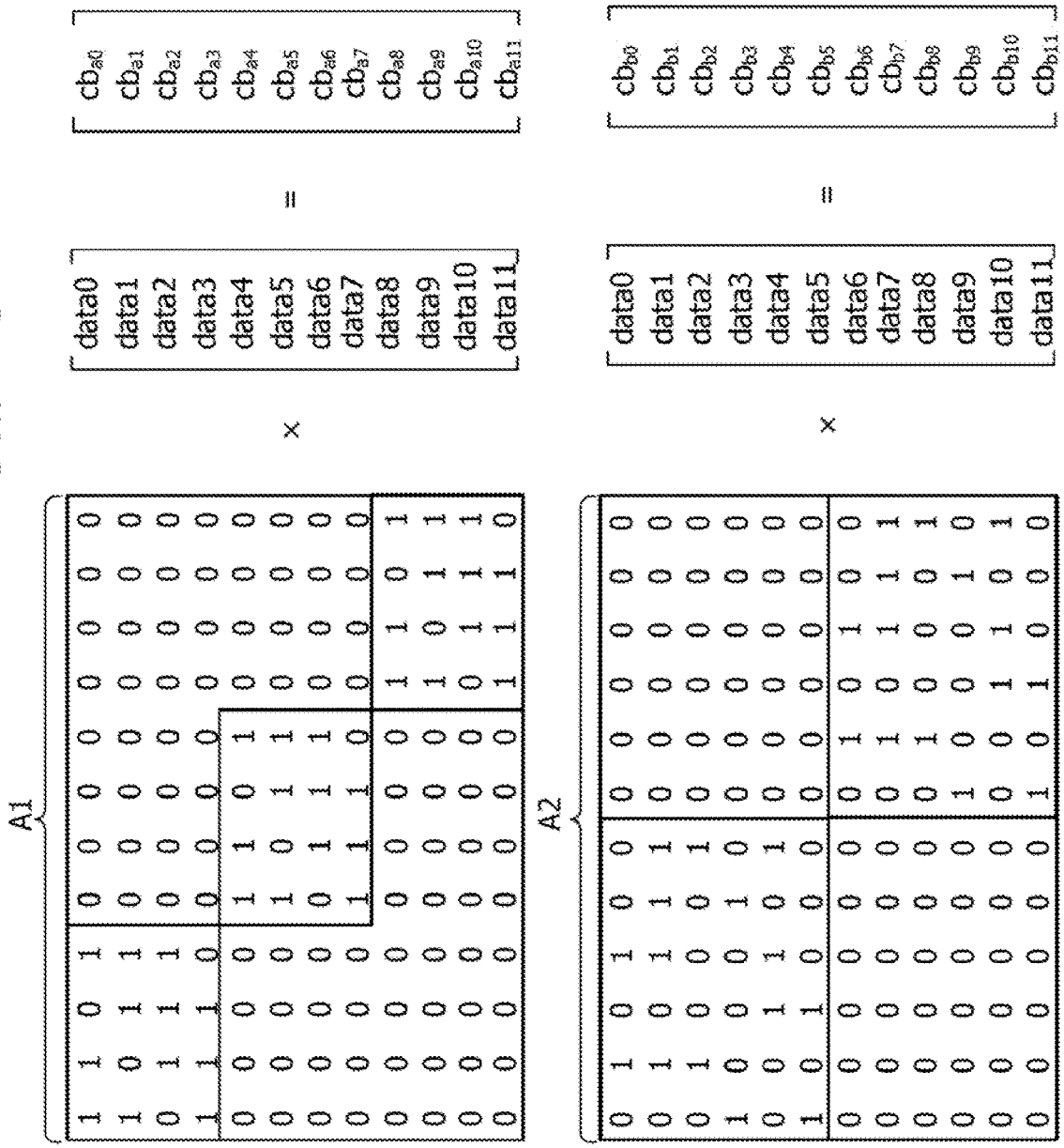
FIG. 13 is a diagram illustrating a calculation example of a check code with the two types of block correction codes.

FIG. 13 is a diagram illustrating a calculation example of a check code with the two types of block correction codes.

The references $cb_{a0}$ to $cb_{a11}$ are check codes obtained by using A1, and the references $cb_{b0}$ to $cb_{b11}$ are check codes obtained by using A2.

Figure 14:
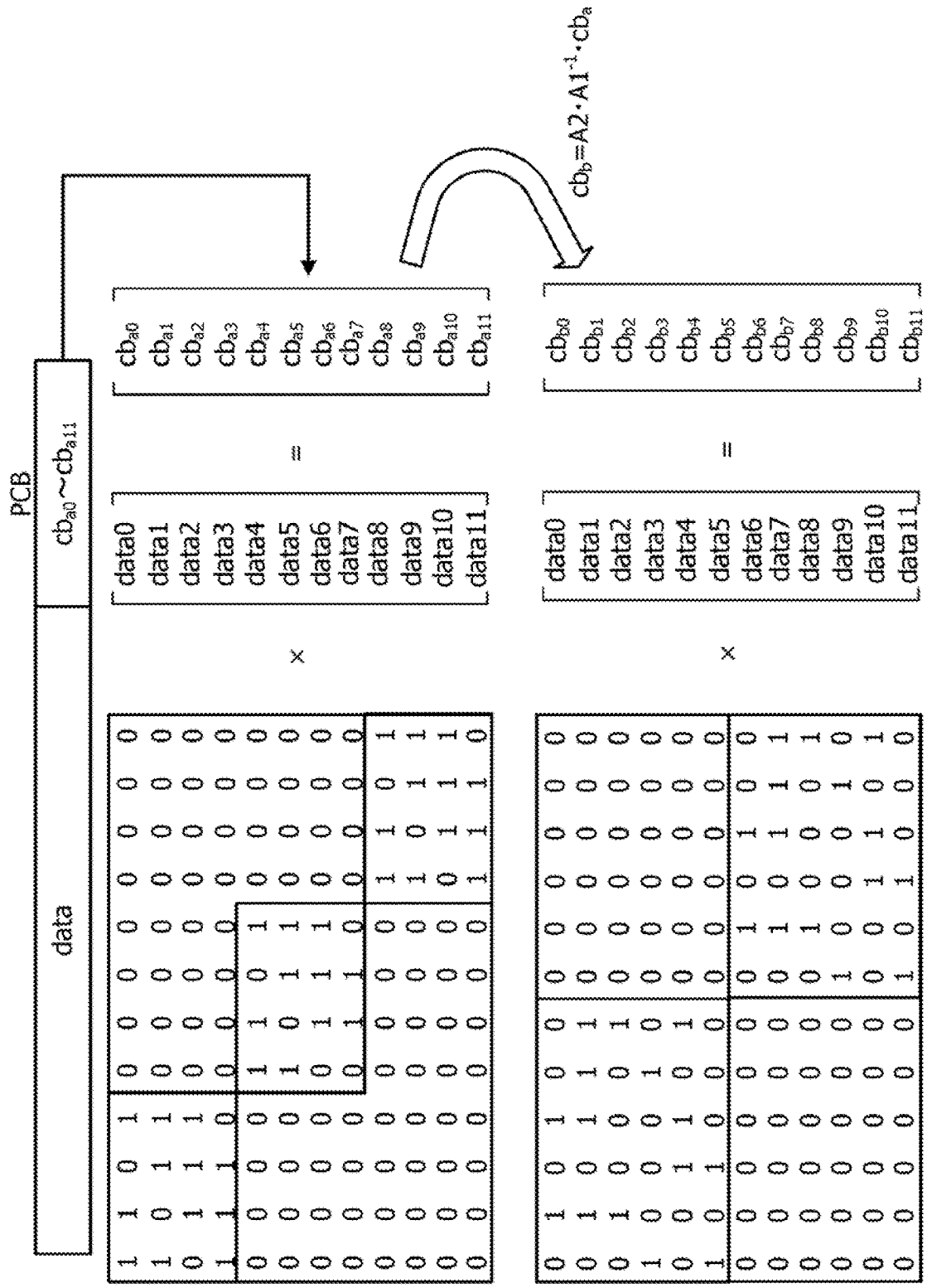
FIG. 14 is a diagram illustrating an example of a correction between the check codes with the two types of block correction codes.

FIG. 14 is a diagram illustrating an example of a correlation between check codes with two types of block correction codes.

When a column vector including $cb_{a0}$ to $cb_{a11}$ is expressed as $cb_a$ and a column vector including data0 to data11 is expressed as data, $cb_a$ is obtained by a formula $cb_a = A1 \cdot data$.

Because A1 is a square matrix, an inverse matrix $A1^{-1}$ is obtained. When a column vector including $cb_{b0}$ to $cb_{b11}$ is expressed as $cb_b$, a relationship $cb_b = A2 \cdot A1^{-1} \cdot A1 \cdot data = A2 \cdot A1^{-1} \cdot cb_a$ can be expressed for $cb_a$, and $cb_a$ can be converted into $cb_b$.

Therefore, the check code generation unit 22b1 adds only $cb_a$ to the data as a PCB and writes the data into the memory 21 so that the error correction unit 22b2 can convert $cb_a$ into $cb_b$ according to the above formula at the time of reading.

For example, in a case where the data5 and the data6 are errors, in H1 in FIG. 12, two-bit errors are included in the same block, and it is not possible to perform correction. In that case, the error correction unit 22b2 converts $cb_a$ into $cb_b$ and performs error correction based on H2 in FIG. 12 so as to make a state where one error is included in one block, and it is possible to perform correction.

In this way, by adding $cb_a$ to the data and writing the data into the memory 21, it is possible to protect the data with two types of correction logics.

Furthermore, because it is only needed to add only $cb_a$ ($cb_{a0}$ to $cb_{a11}$) to the data, the number of check codes (the number of check bits) can be reduced than that when $cb_{a0}$ to $cb_{a11}$ and $cb_{b0}$ to $cb_{b11}$ are concatenated and added to the data. Therefore, deterioration in a data encoding efficiency can be prevented.

Application Example (Part 2) to Two Types of Block Correction Codes

Next, an example will be described in which two types of block correction codes are applied to 24-bit data (data0 to data23).

Of the two types of block correction codes, a correction logic of one block correction code (third correction logic) is to divide the 24-bit data into eight bits×three blocks and correct a one-bit error in each block. A correction logic of another block correction code (fourth correction logic) is to divide the 24-bit data into 12 bits×two blocks and correct a one-bit error in each block.

Figure 15:
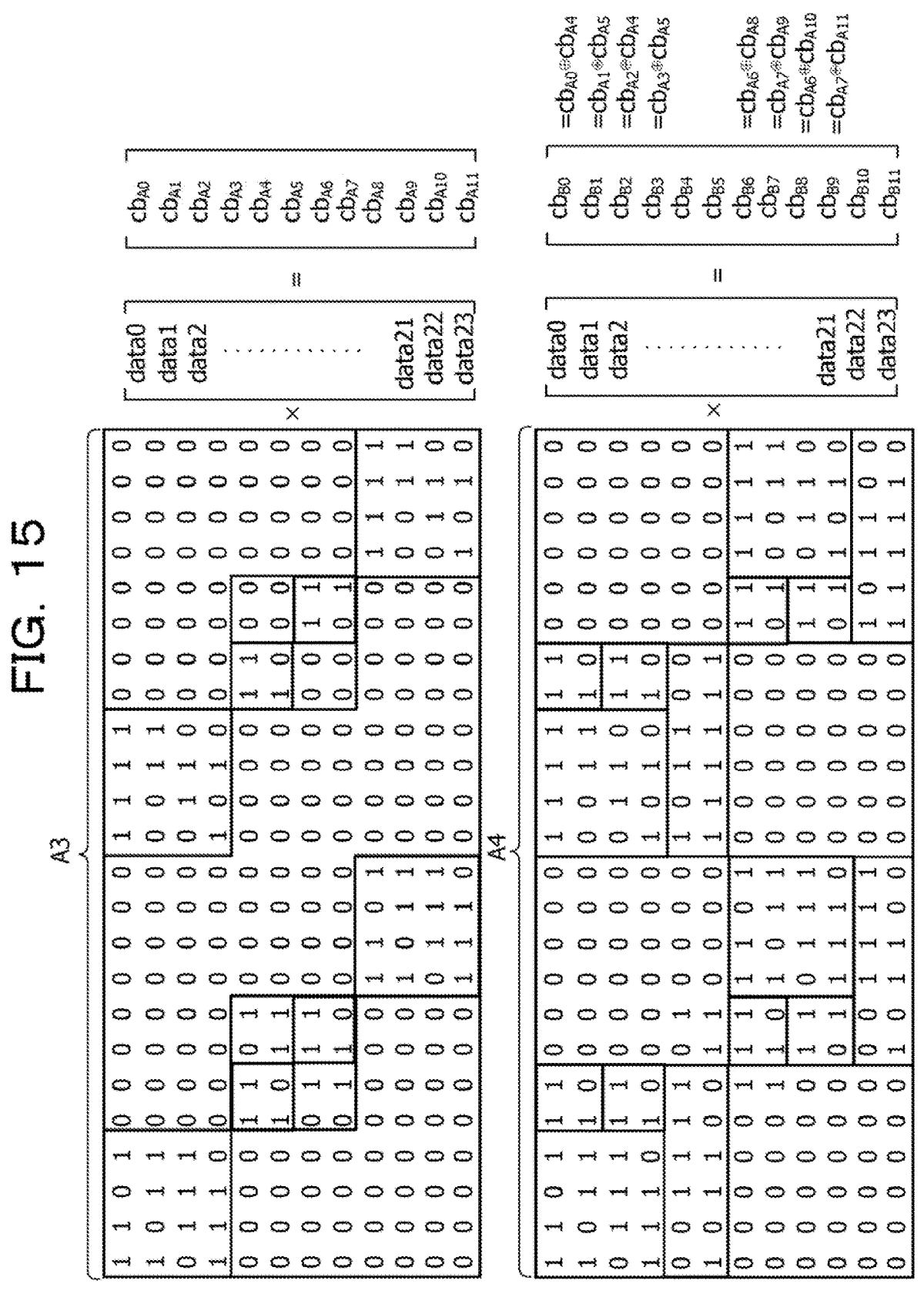

FIG. 15 is a diagram illustrating a calculation example of a check code with the two types of block correction codes.

A3 is a matrix obtained by removing a unit matrix portion from a check matrix in a case where a third correction logic is used, and A4 is a matrix obtained by removing a unit matrix portion from a check matrix in a case where a fourth correction logic is used.

The check code can be expressed as in FIG. 15 using A3 and A4.

The references $cb_{A0}$ to $cb_{A11}$ are check codes obtained by using A3, and the references $cb_{B0}$ to $cb_{B11}$ are check codes obtained by using A4.

Unlike the first application example, because A3 and A4 are not a square matrix, it is not possible to perform conversion using an inverse matrix. Therefore, the check code generation unit 22b1 generates a PCB in which a correlation portion and a non-correlation portion between $cb_A$ (column vector of $cb_{A0}$ to $cb_{A11}$) and $cb_B$ (column vector of $cb_{B0}$ to $cb_{B11}$) are concatenated.

In FIG. 15, according to a similar portion of A3 and A4, $cb_A$ and $cb_B$ have the following relationship.

As illustrated in FIG. 15, $cb_{B0}$ is expressed as an exclusive OR of $cb_{A0}$ and $cb_{A4}$, $cb_{B1}$ is expressed as an exclusive OR of $cb_{A1}$ and $cb_{A5}$, $cb_{B2}$ is expressed as an exclusive OR of $cb_{A2}$ and $cb_{A4}$, and $cb_{B3}$ is expressed as an exclusive OR of $cb_{A3}$ and $cb_{A5}$. Furthermore, $cb_{B6}$ is expressed as an exclusive OR of $cb_{A6}$ and $cb_{A8}$, $cb_{B7}$ is expressed as an exclusive OR of $cb_{A7}$ and $cb_{A9}$, $cb_{B8}$ is expressed as an exclusive OR of $cb_{A6}$ and $cb_{A10}$, and $cb_{B9}$ is expressed as an exclusive OR of $cb_{A7}$ and $cb_{A11}$.

Figure 16:
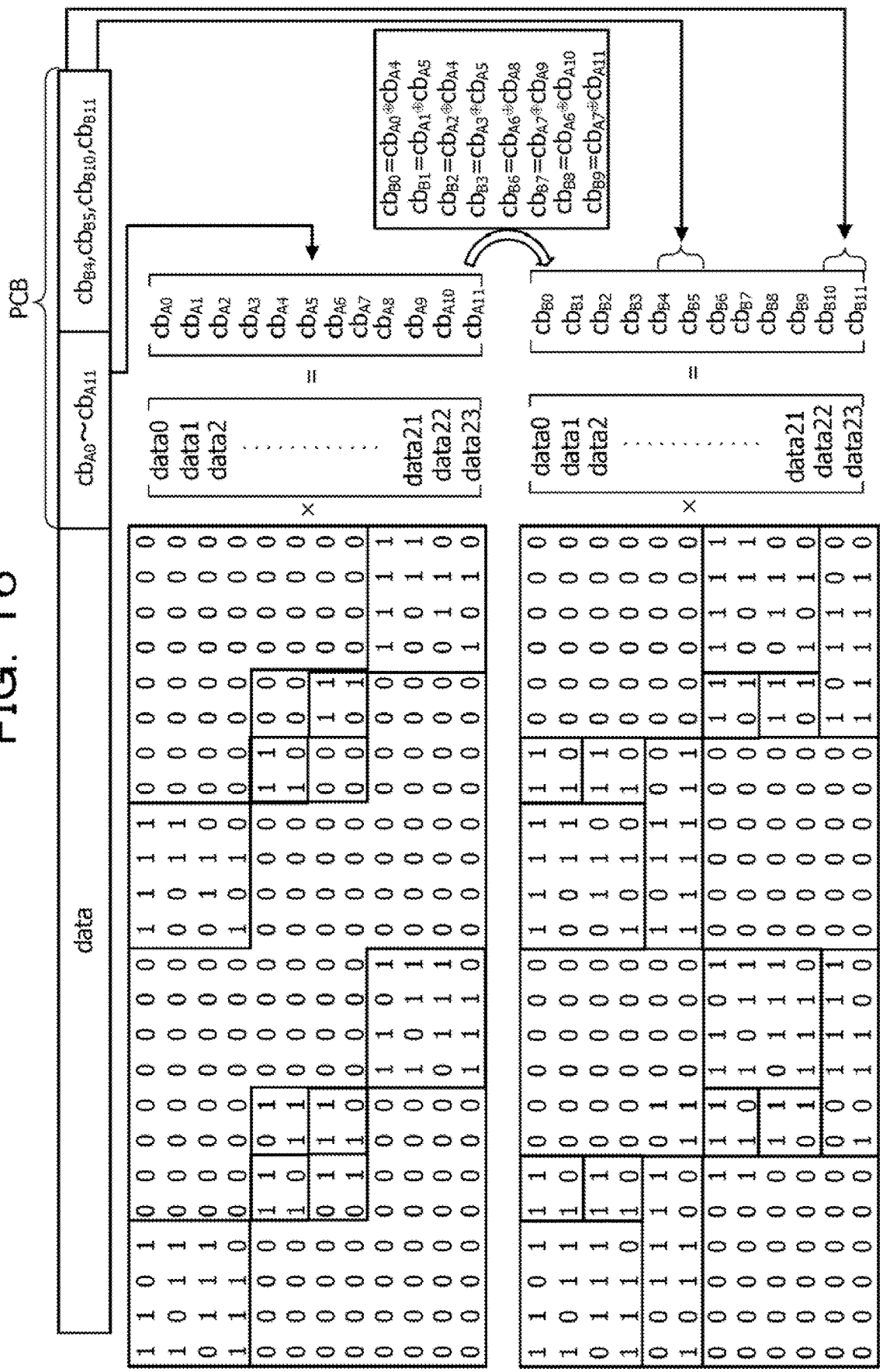
FIG. 16 is a diagram illustrating an example of a correlation between the check codes with the two types of block correction codes.

FIG. 16 is a diagram illustrating an example of a correlation between the check codes with the two types of block correction codes.

As described above, the above-described eight bits of $cb_{B0}$ to $cb_{B11}$ can be obtained from $cb_A$. Therefore, $cb_A$ is assumed as a correlation portion, and a portion of $cb_{B0}$ to $cb_{B11}$ other than the eight bits described above ($cb_{B4}$, $cb_{B5}$, $cb_{B10}$, and $cb_{B11}$) is assumed as a non-correlation portion, and a PCB in which these are concatenated is generated.

Because the non-correlation portion includes only four bits, the number of check codes (the number of check bits) can be reduced than a case where $cb_{A0}$ to $cb_{A11}$ and $cb_{B0}$ to $cb_{B11}$ are concatenated and added to data. Therefore, deterioration in a data encoding efficiency can be prevented.

The check code generation unit 22b1 adds the PCB as in FIG. 16 to the data and writes the data into the memory 21. At the time of reading, the error correction unit 22b2 can obtain $cb_b$ other than $cb_{B4}$, $cb_{B5}$, $cb_{B10}$, and $cb_{B11}$ from $cb_A$ according to the above formula.

In this way, by adding the PCB as illustrated in FIG. 16 to the data and writing the data into the memory 21, it is possible to protect the data with two types of correction logics.

Application Example to Reed-Solomon Code

Next, a case will be described where a Reed-Solomon code and a one-bit correction code are applied as two types of ECCs to be combined.

FIG. 17 is a diagram illustrating an example of a check matrix in a case where a Reed-Solomon code and a one-bit correction code are combined and a calculation example of a check byte.

In FIG. 17, an example of a check matrix including three rows and eight columns is illustrated. a is a primitive element of $F_{256}$ (a set having 256 elements). For example, 256 elements can be generated by $a^x$. Three-byte check bytes ($CB_{A0}$ to $CB_{A2}$) are obtained by a matrix product of this check matrix and the eight-byte data (data0 to data7).

$CB_{A1}$ is a check code of a one-bit correction code with respect to an even-numbered location byte, and $CB_{A2}$ is a check code of a one-bit correction code with respect to an odd-numbered location byte.

FIG. 18 is a diagram illustrating an example of a check matrix of the Reed-Solomon code and a calculation example of the check byte.

In FIG. 18, an example of a check matrix of a Reed-Solomon code including two rows and eight columns is illustrated. Two-byte check bytes ($CB_{B0}$ to $CB_{B1}$) are obtained by a matrix product of this check matrix and the eight-byte data (data0 to data7).

Here, $CB_{B0}$ and $CB_{B1}$ can be expressed using $CB_{A0}$ to $CB_{A2}$. For example, as in FIG. 18, $CB_{B0}=CB_{A0}$, and $CB_{B1}$ can be expressed as an exclusive OR of $CB_{A1}$ and $CB_{A2}$.

Figure 19:
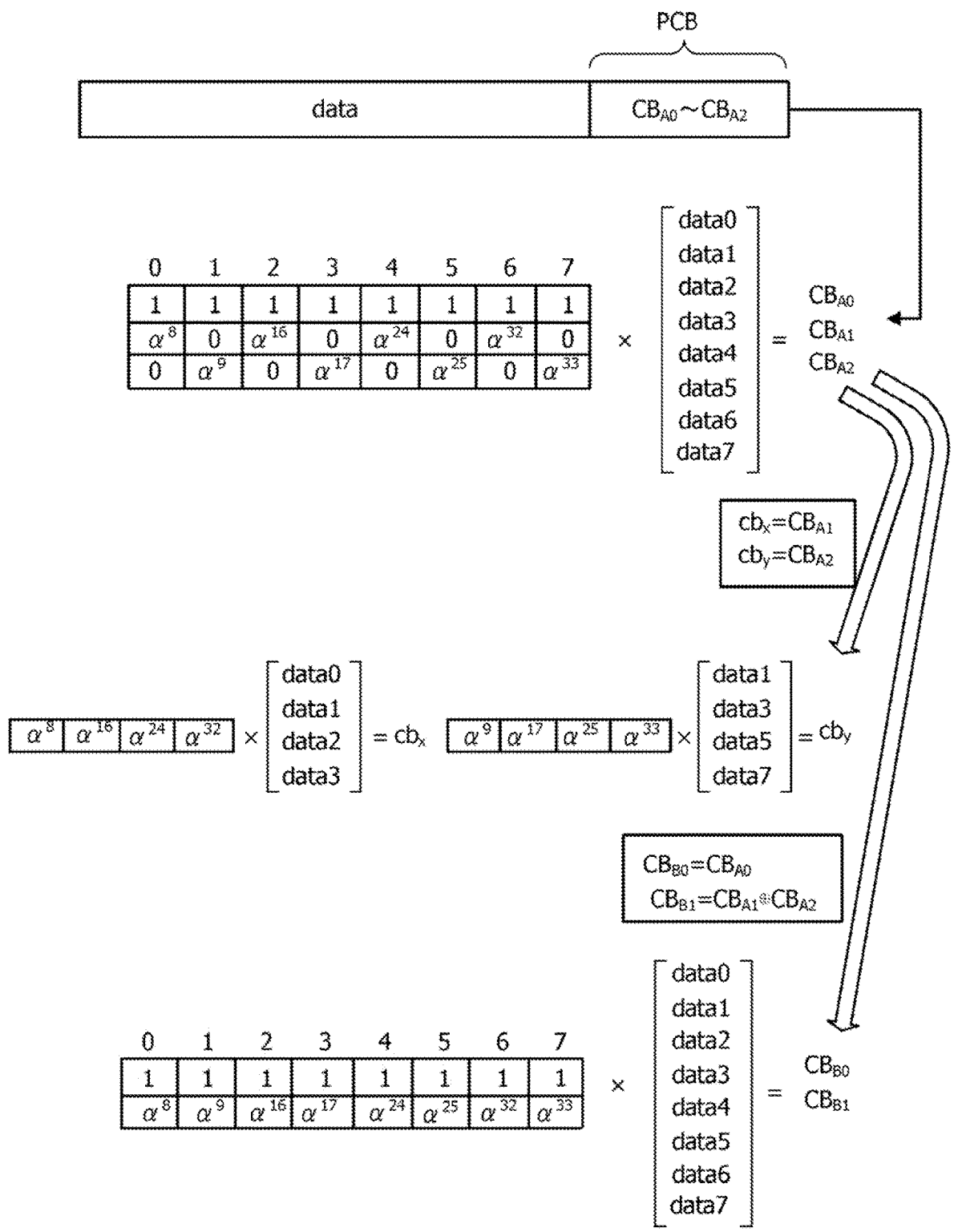
FIG. 19 is a diagram illustrating an example of a correlation between check codes with two types of correction codes including the Reed-Solomon code.

FIG. 19 is a diagram illustrating an example of a correlation between check codes with two types of correction codes including the Reed-Solomon code.

Because $CB_{B0}$ and $CB_{B1}$ can be obtained from $CB_{A0}$ to $CB_{A2}$ as described above, the check code generation unit 22b1 adds a PCB including $CB_{A0}$ to $CB_{A2}$ as in FIG. 18 to the data and writes the data into the memory 21.

Note that, FIG. 19 illustrates that a check code ($cb_x$) of a one-bit correction code with respect to an even-numbered location byte is $CB_{A1}$ and a check code ($cb_y$) of a one-bit correction code with respect to an odd-numbered location byte is $CB_{A2}$.

In this way, by adding the PCB as illustrated in FIG. 19 to the data and writing the data into the memory 21, it is possible to perform protection with the two types of ECCs including the one-bit correction code and the Reed-Solomon code.

Furthermore, because it is sufficient that only $CB_{A0}$ to $CB_{A2}$ be added to the data, the number of check codes (the number of check bits) can be reduced than that in a case where $CB_{A0}$ to $CB_{A2}$ and $CB_{B0}$ and $CB_{B1}$ are concatenated and added to the data. Therefore, deterioration in a data encoding efficiency can be prevented.

In the above, one aspect of the storage device and the control method for the storage device according to the embodiments has been described on the basis of the embodiment. However, this is merely an example, and is not limited to the above description.

For example, a combination of a BCH code and a Reed-Solomon code may also be used as a plurality of types of ECC combinations.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A storage device comprising:
   a memory; and
   a processor configured to,
   at the time of writing data into the memory, select a plurality of types of error correction codes for the data;
   generate a first check code common to the plurality of types of error correction codes based on the data by concatenating a correlation portion between the plurality of types of error correction codes and a non-correlation portion between the plurality of types of error correction codes,
   add the first check code to the data and write the data into the memory, convert the first check code into a second check code based on any one of the plurality of types of error correction codes at the time of reading the data from the memory, and
   perform error correction by using the second check code.

2. The storage device according claim 1, wherein in a case where an error is not resolved by error correction by using the second check code based on a first error correction code of the plurality of types of error correction codes, the processor converts the first check code into a third check code based on a second error correction code of the plurality of types of error correction codes and performs error correction by using the third check code.

3. The storage device according to claim 2, wherein in a case where it is possible to convert the entire third check code from the second check code, the first check code is the second check code.

4. The storage device according to claim 2, wherein in a case where it is possible to convert a part of the third check code from the second check code, the first check code is generated by concatenating the third check code other than the above part to the second check code.

5. The storage device according to claim 2, wherein the first error correction code or the second error correction code is a block correction code, a Reed-Solomon code, or a Bose-Chaudhuri-Hocquenghem (BCH) code.

6. A control method for a storage device comprising:
at the time of writing data into the memory, selecting a plurality of types of error correction codes for the data;
generating a first check code common to the plurality of types of error correction codes based on the data by concatenating a correlation portion between the plurality of types of error correction codes and a non-correlation portion between the plurality of types of error correction codes;
adding the first check code to the data and write the data into the memory;
converting the first check code into a second check code based on any one of the plurality of types of error correction codes at the time of reading the data from the memory; and
performing error correction by using the second check code.

* * * * *